(12) United States Patent
Malhan et al.

(10) Patent No.: US 8,604,540 B2
(45) Date of Patent: Dec. 10, 2013

(54) SEMICONDUCTOR DEVICE AND METHOD OF MANUFACTURING THE SAME

(75) Inventors: Rajesh Kumar Malhan, Nagoya (JP); Naohiro Sugiyama, Nagoya (JP); Yuuichi Takeuchi, Obu (JP)

(73) Assignee: DENSO CORPORATION, Kariya (JP)

( * ) Notice: Subject to any disclaimer, the term of this patent is extended or adjusted under 35 U.S.C. 154(b) by 377 days.

(21) Appl. No.: 12/956,152

(22) Filed: Nov. 30, 2010

(65) Prior Publication Data

US 2011/0133211 A1 Jun. 9, 2011

(30) Foreign Application Priority Data

Dec. 4, 2009 (JP) ................................. 2009-276457

(51) Int. Cl.
*H01L 29/66* (2006.01)
*H01L 21/337* (2006.01)

(52) U.S. Cl.
USPC .................... 257/329; 257/E29.313; 438/191

(58) Field of Classification Search
USPC .............. 257/76, 77, 289, 328, 329, E29.313, 257/259; 438/268, 191
See application file for complete search history.

(56) References Cited

U.S. PATENT DOCUMENTS

| 5,055,723 | A | * | 10/1991 | Bowers et al. | 327/431 |
|---|---|---|---|---|---|
| 5,378,642 | A | * | 1/1995 | Brown et al. | 438/186 |
| 6,020,600 | A | * | 2/2000 | Miyajima et al. | 257/76 |
| 6,133,587 | A | * | 10/2000 | Takeuchi et al. | 257/77 |
| 6,373,102 | B1 | * | 4/2002 | Huang | 257/345 |
| 6,503,782 | B2 | | 1/2003 | Casady et al. | |
| 6,686,616 | B1 | | 2/2004 | Allen et al. | |
| 7,241,694 | B2 | | 7/2007 | Takeuchi et al. | |
| 7,265,399 | B2 | | 9/2007 | Sriram et al. | |
| 7,355,207 | B2 | | 4/2008 | Kumar et al. | |
| 7,402,844 | B2 | | 7/2008 | Sriram | |
| 7,560,325 | B1 | | 7/2009 | Merrett et al. | |
| 7,763,504 | B2 | | 7/2010 | Kumar et al. | |
| 2003/0042538 | A1 | * | 3/2003 | Kumar et al. | 257/328 |
| 2003/0211703 | A1 | * | 11/2003 | Lee et al. | 438/430 |
| 2004/0051159 | A1 | * | 3/2004 | Terashima | 257/506 |
| 2004/0207331 | A1 | * | 10/2004 | Koyama | 315/169.3 |

(Continued)

FOREIGN PATENT DOCUMENTS

| JP | A-7-254614 | 10/1995 | |
|---|---|---|---|
| WO | WO 2007/064463 | 6/2007 | |
| WO | WO 2008026181 A1 * | 3/2008 | ............. H01L 21/18 |
| WO | WO 2009/129049 | 10/2009 | |

OTHER PUBLICATIONS

Office Action mailed Sep. 20, 2011 in corresponding JP application No. 2009-276457 (and English translation).

*Primary Examiner* — William F Kraig
(74) *Attorney, Agent, or Firm* — Posz Law Group, PLC

(57) ABSTRACT

A wide band gap semiconductor device having a JFET, a MESFET, or a MOSFET mainly includes a semiconductor substrate, a first conductivity type semiconductor layer, and a first conductivity type channel layer. The semiconductor layer is formed on a main surface of the substrate. A recess is formed in the semiconductor layer in such a manner that the semiconductor layer is divided into a source region and a drain region. The recess has a bottom defined by the main surface of the substrate and a side wall defined by the semiconductor layer. The channel layer has an impurity concentration lower than an impurity concentration of the semiconductor layer. The channel layer is formed on the bottom and the side wall of the recess by epitaxial growth.

25 Claims, 9 Drawing Sheets

(56) References Cited

U.S. PATENT DOCUMENTS

| | | | |
|---|---|---|---|
| 2004/0217361 A1* | 11/2004 | Negley | 257/79 |
| 2006/0160316 A1 | 7/2006 | Casady et al. | |
| 2006/0199312 A1 | 9/2006 | Harris et al. | |
| 2006/0240627 A1* | 10/2006 | Inoue | 438/289 |
| 2007/0012946 A1 | 1/2007 | Sankin et al. | |
| 2007/0181953 A1* | 8/2007 | Lyu et al. | 257/382 |
| 2007/0275527 A1* | 11/2007 | Merrett et al. | 438/268 |
| 2008/0173974 A1* | 7/2008 | Van Noort et al. | 257/528 |

* cited by examiner

SEMICONDUCTOR DEVICE AND METHOD OF MANUFACTURING THE SAME

CROSS REFERENCE TO RELATED APPLICATION

This application is based on and incorporates herein by reference Japanese Patent Application No. 2009-276457 filed on Dec. 4, 2009.

FIELD OF THE INVENTION

The present invention relates to a wide band gap (WBG) semiconductor switching device having a JFET, a MOSFET, or a MESFET and also relates to a method of manufacturing the WBG semiconductor switching device.

BACKGROUND OF THE INVENTION

FIG. 13 illustrates a cross-sectional view of a junction field-effect transistor (JFET) disclosed in U.S. Pat. No. 7,560, 325. The JFET is made of silicon carbide (SiC), which is a WBG semiconductor material suitable for high frequency and high temperature applications. As shown in FIG. 13, a P$^-$-type buffer layer J2 is formed on a silicon carbide substrate J1, a N$^-$-type channel layer J3 is formed on the P$^-$-type buffer layer J2, and a N$^+$-type layer J4 is formed on the N$^-$-type channel layer J3. A recess J5 extending from a surface of the N$^+$-type layer J4 to the N$^-$-type channel layer J3 is formed by etching the N$^+$-type layer J4. A P$^+$-type gate region J7 is formed in the recess J5 through a P$^-$-type layer J6. A source electrode J9 and a drain electrode J10 are formed through a metal layer J8 in such a manner that the source electrode J9 and the drain electrode J10 are spaced from the P$^+$-type gate region J7.

In U.S. Pat. No. 7,560,325, the recess J5 is formed by etching the N$^+$-type layer J4 without using a stopper layer. Therefore, the etching of the N$^+$-type layer J4 is stopped simply by controlling an etching time. If the N$^+$-type layer J4 is partially left, and the recess J5 does not reach the N$^-$-type channel layer J3, switching characteristics can significantly vary. Therefore, the etching time is determined so that the recess J5 can surely reach the N$^-$-type channel layer J3. In this case, there is a fear that the N$^-$-type channel layer J3 will be over etched. As a result, the thickness of the N$^-$-type channel layer J3 may vary, and characteristics of the JFET may vary.

The above discussion regarding the thickness variation of a channel layer can be applied to a metal-semiconductor field-effect transistor (MESFET) and a metal-oxide-semiconductor field-effect transistor (MOSFET).

In view of the above, it is an object of the present invention to provide a WBG semiconductor device having a JFET, a MESFET, or MOSFET in which a variation in thickness of a channel layer can be reduced. It is another object of the present invention to provide a method of manufacturing the WBG semiconductor device.

SUMMARY OF THE INVENTION

According to a first aspect of the present invention, a WBG semiconductor device having a JFET includes a semi-insulating (SI) or first or second conductivity conductive semiconductor substrate, a first conductivity type semiconductor layer epitaxially grown on a main surface of the substrate, and a recess having a bottom defined by the main surface of the substrate and a side wall defined by the semiconductor layer. The recess divides the semiconductor layer into a source region and a drain region. The semiconductor device further includes a first conductivity type channel layer epitaxially grown on the bottom and the side wall of the recess. The channel layer has an impurity concentration lower than an impurity concentration of the semiconductor layer. The semiconductor device further includes a second conductivity type gate region epitaxially grown on a surface of the channel layer. The gate region is spaced by the channel layer from the source region and the drain region. The semiconductor device further includes a gate electrode electrically connected to the gate region, a source electrode electrically connected to the source region, a drain electrode electrically connected to the drain region.

According to a second aspect of the present invention, a semiconductor device having a MESFET includes a semiconductor substrate, a first conductivity type semiconductor layer epitaxially grown on a main surface of the substrate, a recess having a bottom defined by the main surface of the substrate and a side wall defined by the semiconductor layer. The recess divides the semiconductor layer into a source region and a drain region. The semiconductor device further includes a first conductivity type channel layer epitaxially grown on the bottom and the side wall of the recess. The channel layer has an impurity concentration lower than an impurity concentration of the semiconductor layer. The semiconductor device further includes a gate electrode located on a surface of the channel layer to form a Schottky contact with the channel layer. The gate electrode is spaced by the channel layer from the source region and the drain region. The semiconductor device includes a source electrode electrically connected to the source region, and a drain electrode electrically connected to the drain region.

According to a third aspect of the present invention, a semiconductor device having a MOSFET includes a semiconductor substrate, a first conductivity type semiconductor layer epitaxially grown on a main surface of the substrate, and a recess having a bottom defined by the main surface of the substrate and a side wall defined by the semiconductor layer. The recess divides the semiconductor layer into a source region and a drain region. The semiconductor device further includes a first conductivity type channel layer epitaxially grown on the bottom and the side wall of the recess. The channel layer has an impurity concentration lower than an impurity concentration of the semiconductor layer. The semiconductor device further includes a gate insulating layer on a surface of the channel layer, a gate electrode on the surface of the channel layer through the gate insulating layer, a source electrode electrically connected to the source region, and a drain electrode electrically connected to the drain region.

According to a fourth aspect of the present invention, a method of making a semiconductor device having a JFET includes preparing a semiconductor substrate, forming a first conductivity type semiconductor layer on a main surface the substrate by epitaxial growth, forming a recess by anisotropic etching of the semiconductor layer in such a manner that the recess divides the semiconductor layer into a source region and a drain region and has a bottom defined by the main surface of the substrate and a side wail defined by the semiconductor layer, forming a first conductivity type channel layer on the bottom and the side wall of the recess by epitaxial growth in such a manner that the channel layer has an impurity concentration lower than an impurity concentration of the semiconductor layer, forming a second conductivity type gate region on a surface of the channel layer by epitaxial growth in such a manner that the gate region is spaced by the channel layer from the source region and the drain region, forming a gate electrode electrically connected to the gate region, forming a source electrode electrically connected to the source region, and forming a drain electrode electrically connected to the drain region.

According to a fifth aspect of the present invention, a method of making a semiconductor device having a MESFET includes preparing a semiconductor substrate, forming a first conductivity type semiconductor layer on a main surface the substrate by epitaxial growth, forming a recess by anisotropic etching of the semiconductor layer in such a manner that the recess divides the semiconductor layer into a source region and a drain region and has a bottom defined by the main surface of the substrate and a side wall defined by the semiconductor layer, forming a first conductivity type channel layer on the bottom and the side wall of the recess by epitaxial growth in such a manner that the channel layer has an impurity concentration lower than an impurity concentration of the semiconductor layer, forming a gate electrode on a surface of the channel layer by epitaxial growth in such a manner that the gate electrode forms a Schottky contact with the channel layer and is spaced by the channel layer from the source region and the drain region, forming a source electrode electrically connected to the source region, and forming a drain electrode electrically connected to the drain region.

According to a sixth aspect of the present invention, a method of making a semiconductor device having a MOSFET includes preparing a semiconductor substrate, forming a first conductivity type semiconductor layer on a main surface the substrate by epitaxial growth, forming a recess by anisotropic etching of the semiconductor layer in such a manner that the recess divides the semiconductor layer into a source region and a drain region and has a bottom defined by the main surface of the substrate and a side wall defined by the semiconductor layer, forming a first conductivity type channel layer on the bottom and the side wall of the recess by epitaxial growth in such a manner that the channel layer has an impurity concentration lower than an impurity concentration of the semiconductor layer, forming an gate insulating layer on a surface of the channel layer, forming a gate electrode on the gate insulating layer, forming a source electrode electrically connected to the source region, and forming a drain electrode electrically connected to the drain region.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 1:
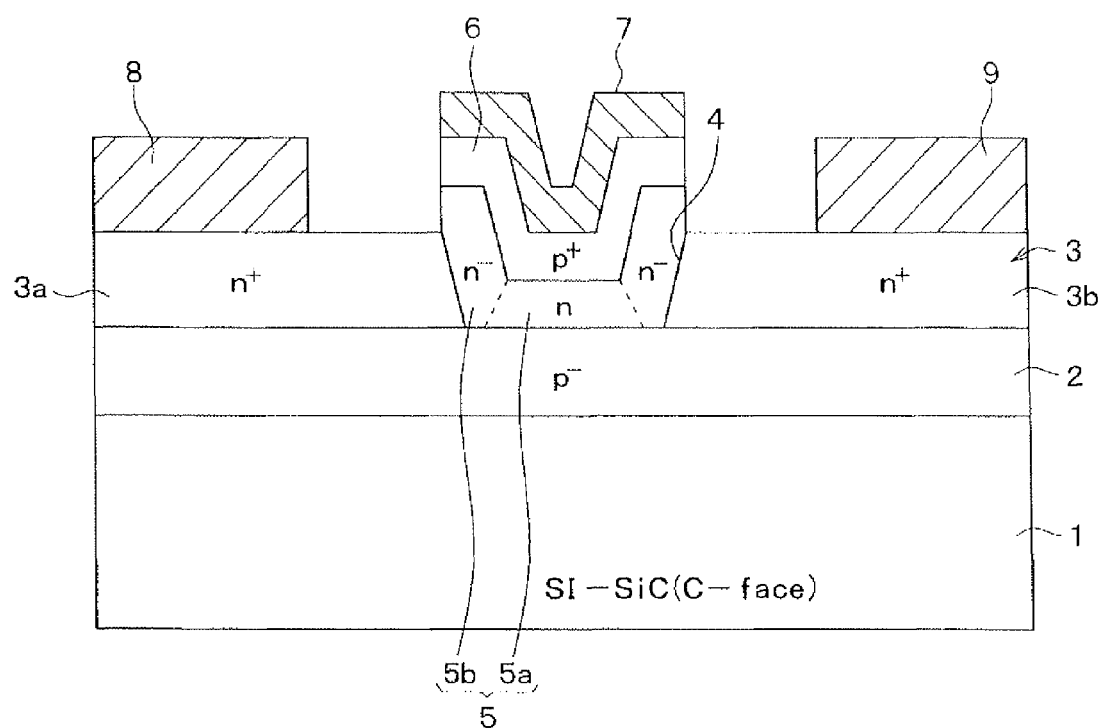
FIG. 1 is a diagram illustrating a cross-sectional view of a SiC semiconductor device having a JFET according to a first embodiment of the present invention.

Embodiments of the present invention are described below with reference to the drawings. Throughout the embodiments, the same symbols are given to the same or corresponding parts in the drawings.

First Embodiment

A first embodiment of the present invention is described below with reference to FIG. 1. FIG. 1 illustrates a cross-sectional view of a SiC semiconductor device having a JFET according to the first embodiment.

The SiC semiconductor device shown in FIG. 1 is formed by using a semi-insulating SiC substrate 1 having a main surface that is C-face (000-1). The "semi-insulating" means that it is made of non-doped semiconductor material and has a resistivity (or conductivity) closer to that of insulating material. According to the first embodiment, the SiC substrate 1 can have a resistivity of from about $1\times10^{10}$ $\Omega\cdot$cm to about $1\times10^{11}$ $\Omega\cdot$cm and a thickness of from about 50 µm to about 400 µm. For example, the SiC substrate 1 can have the thickness of about 350 µm.

A $P^-$-type buffer layer 2 is formed on the surface of the SiC substrate 1. The $P^-$-type buffer layer 2 can have a P-type impurity concentration of from about $1\times10^{16}$ cm$^{-3}$ to about $1\times10^{17}$ cm$^{-3}$ and a thickness of from about 0.2 µm to about 2.0 µm. For example, the $P^-$-type buffer layer 2 can have the P-type impurity concentration of about $1\times10^{16}$ cm$^{-3}$ and have the thickness of about 0.4 µm. The $P^-$-type buffer layer 2 allows the SiC semiconductor device to have high resistance to voltage breakdown.

A $N^+$-type layer 3 is formed on a surface of the $P^-$-type buffer layer 2. The $N^+$-type layer 3 is divided in two regions by a recess 4. The region of the $N^+$-type layer 3 located on the left side in FIG. 1 with respect to the recess 4 serves as a $N^+$-type source region 3a, and the region of the $N^+$-type layer 3 located on the right side in FIG. 1 with respect to the recess 4 serves as a $N^+$-type drain region 3b. Each of the $N^+$-type source region 3a and the $N^+$-type drain region 3b can have a N-type impurity concentration of from about $5\times10^{18}$ cm$^{-3}$ to about $1\times10^{20}$ cm$^{-3}$ and a thickness of from about 0.1 µm to about 1.0 µm. For example, each of the $N^+$-type source region 3a and the IV-type drain region 3b can have the N-type impurity concentration of about $2\times10^{19}$ cm$^{-3}$ and the thickness of about 0.4 µm.

The recess 4 extends from a surface of the N$^+$-type layer 3 to the P$^-$-type buffer layer 2. In short, the recess 4 penetrates the N$^+$-type layer 3. A side wall of the recess 4 can be parallel to a direction perpendicular to the surface of the substrate 1 as shown in FIGS. 3A-4E. It means that the side wall of the recess 4 is almost parallel to a-face plane i.e., (11-20) or (1-100). Alternatively, as shown in FIG. 1, the side wall of the recess 4 can be slightly inclined with respect to the direction perpendicular to the surface of the substrate 1. In this case, the side wall of the recess 4 is not parallel to a-face plane.

A N-type channel layer 5 is formed in the recess 4 so that a bottom wall and the side wall and of the recess 4 can be covered with the N—type channel layer 5. Specifically, the bottom wall of the recess 4 is covered with a first region 5a of the N-type channel layer 5, and the side wall of the recess 4 is covered with a second region 5b of the N-type channel layer 5. That is, the first region 5a is formed on C-face, and the second region 5b is formed on the a-face. It is noted that the first and second regions 5a, 5b of the N-type channel layer 5 have different impurity concentrations. The impurity concentrations of the first and second regions 5a, 5b depend on trench side wall angle orientation and the C/Si ratio of the epitaxial growth conditions of the N-type channel layer 5. According to the first embodiment, the impurity concentration of the first region 5a can be about twice to ten times greater than the impurity concentration of the second region 5b, and the first region 5a can have a N-type impurity concentration of from about $1\times10^{16}$ cm$^{-3}$ to about $1\times10^{18}$ cm$^{-3}$. For example, the first region 5a can have the N-type impurity concentration of about $1\times10^{17}$ cm$^{-3}$. The first region 5a can have a thickness of from about 0.1 µm to 1.0 µm. For example, the first region 5a can have the thickness of about 0.2 µm.

A P$^+$-type gate region 6 is formed on a surface of the N-type channel layer 5. The impurity concentration of the P$^+$-type gate region 6 is greater than the impurity concentration of the P$^-$-type buffer layer 2. The P$^+$-type gate region 6 is spaced by the N-type channel layer 5 from the N$^+$-type source region 3a and the N$^+$-type drain region 3b. The P$^+$-type gate region 6 can have a P-type impurity concentration of from about $5\times10^{18}$ cm$^{-3}$ to about $5\times10^{19}$ cm$^{-3}$ and a thickness of from about 0.1 µm to about 0.5 µm. For example, the P$^+$-type gate region 6 can have the P-type impurity concentration of about $1\times10^{19}$ cm$^{-3}$ and the thickness of about 0.4 µm.

A gate electrode 7 is formed on a surface of the P$^+$-type gate region 6. End surfaces (i.e., side walls) of the N-type channel layer 5, the P$^+$-type gate region 6, and the gate electrode 7 are aligned with each other to from a continuous flat surface. The gate electrode 7 can have a multilayer structure. For example, the gate electrode 7 has a three-layer structure including a nickel-based metal silicide (e.g., NiSi$_2$) metal layer forming ohmic contact with the P$^+$-type gate region 6, a titanium-based metal layer on the nickel-based layer, and an aluminum layer or a gold layer on the titanium-based layer. The aluminum layer or the gold layer is electrically connected to a bonding wire or the like that is electrically connected to external circuitry. The nickel-based metal layer can have a thickness of from about 0.1 µm to about 0.5 µm, the titanium-based metal layer can have a thickness of from about 0.1 µm to about 0.5 µm, and the aluminum layer or the gold layer can have a thickness of from about 1.0 µm to about 5.0 µm. For example, the nickel-based metal layer can have the thickness of about 0.2 µm, the titanium-based metal layer can have the thickness of about 0.1 µm, and the aluminum layer or the gold layer can have the thickness of about 3.0 µm. In FIG. 1, the gate electrode 7 has a recess corresponding to a recess of the P$^+$-type gate region 6. Alternatively, the recess of the P$^+$-type gate region 6 can be filled with the gate electrode 7 so that a surface of the gate electrode 7 can be flattened.

A source electrode 8 is formed on the N$^+$-type source region 3a, and a drain electrode 9 is formed on the N$^+$-type drain region 3b. For example, the source electrode 8 and the drain electrode 9 can be made of the same material as the gate electrode 7.

In this way, the JFET is formed in the SiC semiconductor device. Although not shown in the drawings, the electrodes are electrically insulated from each other by an interlayer dielectric film and a protection film such as a silicon oxide film and a silicon nitride film.

The JFET formed in the SiC semiconductor device operates as follows. When a gate bias is not applied to the gate electrode 7 i.e., gate bias=0V, the N-type channel layer 5 pinches off due to a depletion layer extending from the P$^+$-type gate region 6 through the N-type channel layer 5 (and a depletion layer extending from the P$^-$-type buffer layer 2 through the N-type channel layer 5). Then, when the positive gate bias is applied to the gate electrode 7 i.e. gate bias=2.5V, the depletion layer extending from the P$^+$-type gate region 6 is reduced. As a result, a channel region is formed in the N-type channel layer 5, and electric current flows between the source electrode 8 and the drain electrode 9 through the channel region. Thus, the JFET can act as a normally-off type device.

The N-type channel layer 5 is epitaxially grown in the recess 4. In such an approach, the N-type channel layer 5 can have a uniform thickness so that the JFET can have uniform characteristics.

Figure 13:
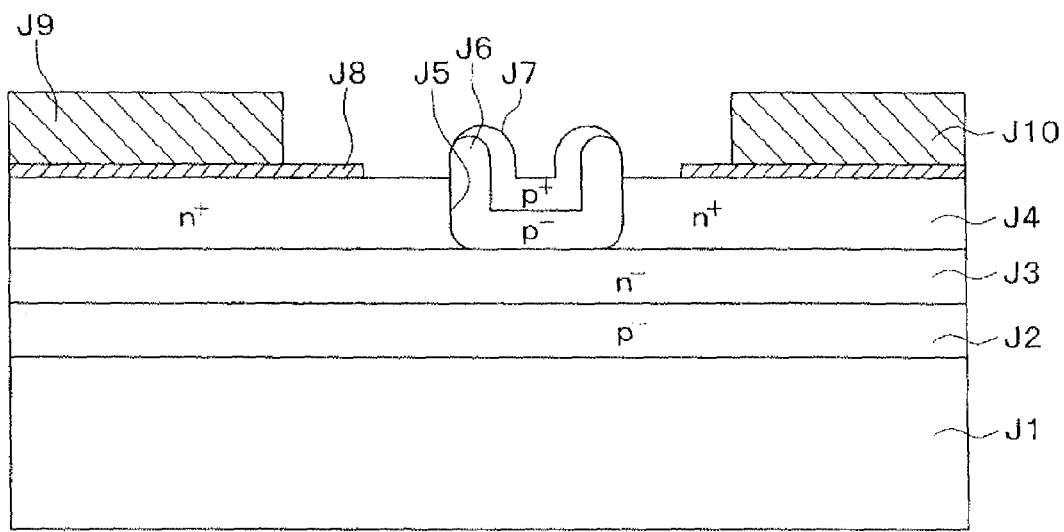
FIG. 13 is a diagram illustrating a cross-sectional view of a conventional SiC semiconductor device having a JFET.

The P$^+$-type gate region 6 is formed in the recess 4 through the N-type channel layer 5. In such an approach, there is no need to form an additional P$^-$-type layer, which has a lower impurity concentration less than the P$^+$-type gate region 6, between the N$^+$-type layer 3 and the P$^+$-type gate region 6 as shown in FIG. 13, where the P$^+$-type gate results in highly doped P$^+$N$^+$ junction thereby degrade the gate performance. Therefore, the width of the depletion layer extending through the N-type channel layer 5 can be controlled by the P$^+$-type gate region 6 that is in direct contact with the N-type channel layer 5. Thus, as compared to when the additional P$^-$-type layer is formed between the N$^+$-type layer 3 and the P$^+$-type gate region 6, the gate voltage applied to the gate electrode 7 can be reduced. This abrupt junctions leads to better gate switching controls. Therefore JFET can perform high speed switching and is, suitable for high frequency application.

The SiC substrate 1 is made of semi-insulating material. In such an approach, radio frequency (RF) waves generated when the JFET operates can be absorbed by the SiC substrate 1. Therefore, the SiC semiconductor device can be suitable for high frequency application.

Figure 2:
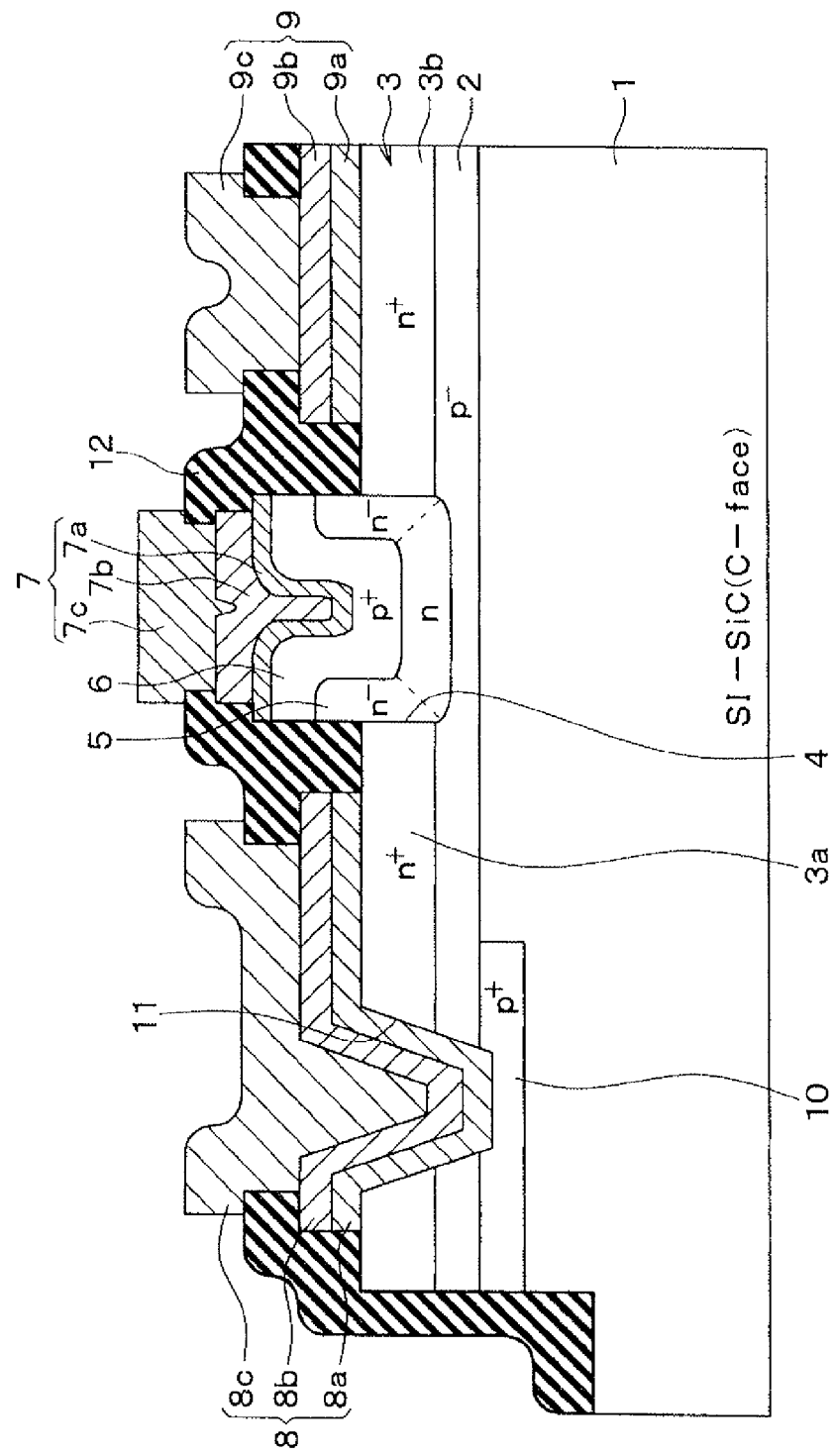
FIG. 2 is a diagram illustrating a cross-sectional view of a concrete example of the SiC semiconductor device of FIG. 1.

According to the first embodiment, the JFET has the P$^-$-type buffer layer 2, and ground connection can be achieved by electrically connecting the P$^-$-type buffer layer 2 to the source electrode 8. FIG. 2 illustrates a concrete example of the SiC semiconductor device having the JFET in which the P$^-$-type buffer layer 2 is electrically connected to the source electrode 8.

As shown in FIG. 2, a P$^+$-type contact region 10 is formed in a surface portion of the SiC substrate 1 so that the P$^+$-type contact region 10 can be in contact with the P$^-$-type buffer layer 2. The P$^+$-type contact region 10 is located at a position where the P$^-$-type buffer layer 2 is electrically connected to the source electrode 8. A recess 11 is formed at the position. The recess 11 penetrates the N$^+$-type source region 3a and the P⁻-type buffer layer 2 and reaches the P⁺-type contact region 10. The source electrode 8 is elongated and located in the recess 11 so that the P⁻-type buffer layer 2 can be electrically connected to the source electrode 8 in the recess 11. The source electrode 8 is electrically insulated from the gate electrode 7 and the drain electrode 9 by an interlayer dielectric film 12. In this way, the P⁻-type buffer layer 2 is electrically connected to the source electrode 8 so that the P⁻-type buffer layer 2 can be clamped to ground.

In the example shown in FIG. 2, each of the gate electrode 7, the source electrode 8, and the drain electrode 9 has a three-layer structure. The gate electrode 7 has a first layer 7a made of nickel-based metal, a second layer 7b made of titanium-based metal, and a third layer 7c made of aluminum layer or gold. The source electrode 8 has a first layer 8a made of nickel-based metal, a second layer 8b made of titanium-based metal, and a third layer 8c made of aluminum layer or gold. The drain electrode 9 has a first layer 9a made of nickel-based metal, a second layer 9b made of titanium-based metal, and a third layer 9c made of aluminum layer or gold.

Next, a method of manufacturing the SiC semiconductor device shown in FIG. 2 is described below with reference to FIGS. 3A-4E.

Figure 3A:
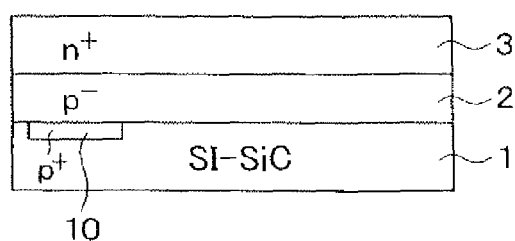
FIGS. 3A-3F are diagrams illustrating cross-sectional views of manufacturing processes of the SiC semiconductor device of FIG. 2.

In a process shown in FIG. 3A, the semi-insulating SiC substrate 1 having a main surface that is C-face is prepared, and P-type impurities are ion implanted into the main surface of the SiC substrate 1. Then, activation is performed, for example, by thermal treatment so that the P⁺-type contact region 10 can be formed in the surface portion of the SiC substrate 1. Then, the P⁻-type buffer layer 2 is epitaxially grown on the main surface of the SiC substrate 1. The P⁻-type buffer layer 2 can have a P-type impurity concentration of from about $1\times10^{16}$ cm$^{-3}$ to about $1\times10^{17}$ cm$^{-3}$ and a thickness of from about 0.2 µm to about 2.0 µm. For example, the P⁻-type buffer layer 2 can have the P-type impurity concentration of about $1\times10^{16}$ cm$^{-3}$ and have the thickness of about 0.4 µm. Then, the N⁺-type layer 3 is epitaxially grown on the P⁻-type buffer layer 2. The N⁺-type layer 3 can have a N-type impurity concentration of from about $5\times10^{18}$ cm$^{-3}$ to about $1\times10^{20}$ cm$^{-3}$ and a thickness of from about 0.1 µm to about 1.0 µm. For example, the N⁺-type layer 3 can have the N-type impurity concentration of about $2\times10^{19}$ cm$^{-3}$ and the thickness of about 0.4 µm.

Figure 3D:
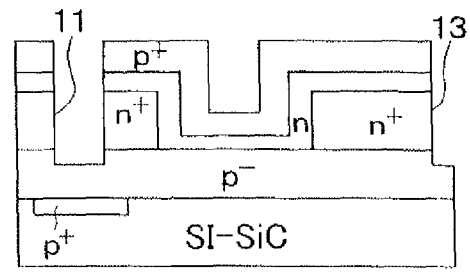
Figure 3B:
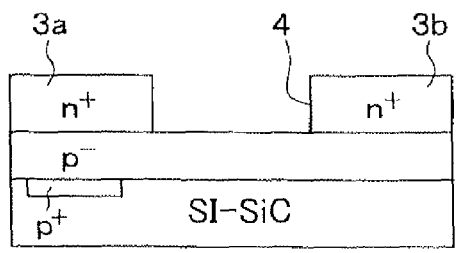

In a process shown in FIG. 3B, the recess 4 reaching the P⁻-type buffer layer 2 is formed by partially etching the N⁺-type layer 3. Specifically, a metal mask (not shown) or an etching mask (not shown) such as a SiO$_2$ mask formed by photolithography is placed on the N⁺-type layer 3 to cover a region where the recess 4 is not formed. Then, anisotropic etching such as reactive ion etching (RIE) is performed by using the mask so that the recess 4 can be formed. In a case where the metal mask is used to form the recess 4, the side wall of the recess 4 can be inclined at an angle of from about 89° to about 90° with respect to the bottom wall of the recess 4. Therefore, the side wall of the recess 4 becomes almost parallel to a-face plane. In another case where the etching mask such as a SiO$_2$ mask is used to form the recess 4, the side wall of the recess 4 can be inclined at an angle of from about 85° to about 86° with respect to the bottom wall of the recess 4. In this case, the side wall of the recess 4 is not parallel to a-face plane, but parallel to high index plane with exptaxial properties close to the a-face plane.

Figure 3E:
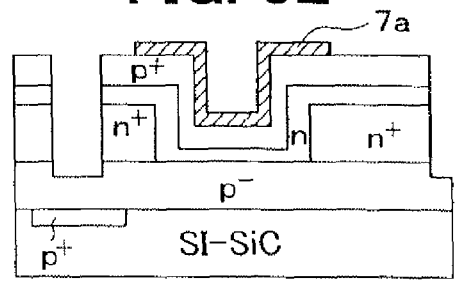
Figure 3C:
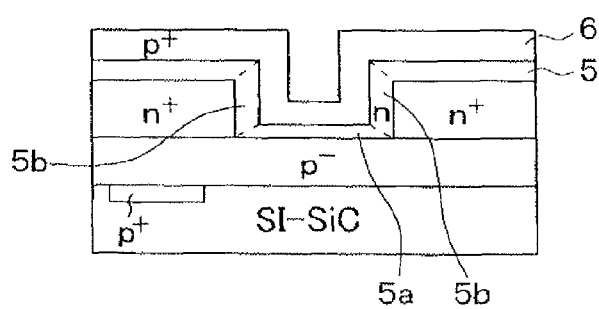

In a process shown in FIG. 3C, the N-type channel layer 5 is epitaxially grown on the surface of the N⁺-type layer 3 and inside the recess 4. The N-type channel layer 5 can have a thickness of from about 0.1 µm to about 1.0 µm. For example, the N-type channel layer 5 can have the thickness of about 0.2 µm. It is noted that the epitaxial growth of the N-type channel layer 5 is performed in such a manner that a region of the N-type channel layer 5 grown on the bottom wall of the recess 4 can have a N-type impurity concentration of from about $1\times10^{16}$ cm$^{-3}$ to about $1\times10^{18}$ cm$^{-3}$. For example, the epitaxial growth of the N-type channel layer 5 can be performed in such a manner that the region of the N-type channel layer 5 grown on the bottom wall of the recess 4 can have the N-type impurity concentration of about $1\times10^{17}$ cm$^{-3}$. In this way, the first region 5a of the N-type channel layer 5 on the bottom wall of the recess 4 and the second region 5b of the N-type channel layer 5 on the side wall of the recess 4 can have different impurity concentrations. The impurity concentration of the first region 5a can be about twice to ten times greater than the impurity concentration of the second region 5b. In such an approach, the N-type channel layer 5 can have uniform thickness and uniform impurity concentration.

Then, the P⁺-type gate region 6 is epitaxially grown on the surface of the N-type channel layer 5. The P⁺-type gate region 6 can have a P-type impurity concentration of from about $5\times10^{18}$ cm$^{-3}$ to about $5\times10^{19}$ cm$^{-3}$ and a thickness of from about 0.1 µm to about 0.5 µm. For example, the P⁺-type gate region 6 can have the P-type impurity concentration of about $1\times10^{19}$ cm$^{-3}$ and the thickness of about 0.4 µm.

Then, in a process shown in FIG. 3D, a mask (not shown) is placed on the P⁺-type gate region 6 to cover a region where the recess 11 is not formed. Then, anisotropic etching such as reactive ion etching (RIE) is performed by using the mask so that the recess 11 can be formed. Although not shown in the drawings, a recess for allowing the JFET to be electrically isolated from another device can be formed in this process.

Then, in a process shown in FIG. 3E, a metal mask (not shown) or an etching mask (not shown) such as a SiO$_2$ mask is placed on the P⁺-type gate region 6 including the recess 11 to cover a region where the gate electrode 7 is not formed. Then, a nickel-based metal layer is formed on the P⁺-type gate region 6 through the mask. Then, the mask is removed so that the first layer 7a of the gate electrode 7 can be formed by a lift-off method.

Figure 3F:
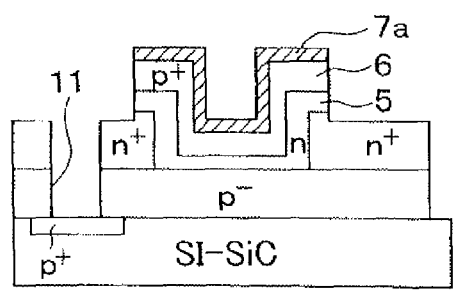

Then, in a process shown in FIG. 3F, anisotropic etching is performed by using the first layer 7a as a mask. As a result, the P⁺-type gate region 6 and the N-type channel layer 5 are patterned into a predetermined shape, and also the recess 11 is elongated to reach the P⁺-type contact region 10. Thus, the end surfaces (i.e., side walls) of the N-type channel layer 5, the P⁺-type gate region 6, and the gate electrode 7 are aligned with each other to from a continuous flat surface.

Figure 4A:
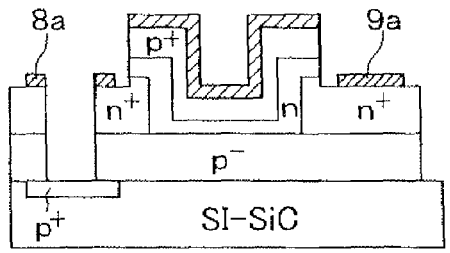
FIGS. 4A-4E are diagrams illustrating cross-sectional views of manufacturing processes, following FIGS. 3A-3F, of the SiC semiconductor device of FIG. 2.

Then, in a process shown in FIG. 4A, a metal mask (not shown) or an etching mask (not shown) such as a SiO$_2$ mask is placed to cover a region where the source electrode 8 and the drain electrode 9 are not formed. Then, a nickel-based metal layer is formed through the mask. Then, the mask is removed so that the first layers 8a, 9a of the source electrode 8 and the drain electrode 9 can be formed by a lift-off method.

Figure 4B:
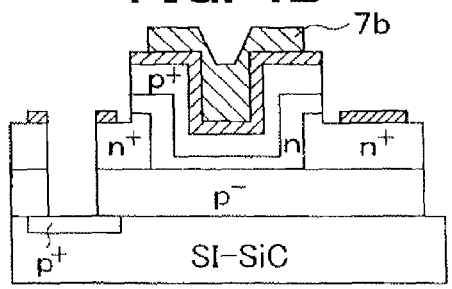

Then, in a process shown in FIG. 4B, a metal mask (not shown) or an etching mask (not shown) such as a SiO$_2$ mask is placed to cover a region where the gate electrode 7 is not formed. Then, a titanium-based metal layer is formed through the mask. Then, the mask is removed so that the second layer 7b of the gate electrode 7 can be formed by a lift-off method.

Figure 4C:
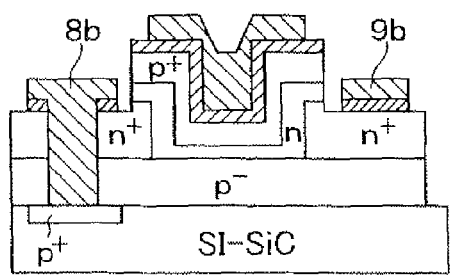

Then, in a process shown in FIG. 4C, a metal mask (not shown) or an etching mask (not shown) such as a SiO$_2$ mask is placed to cover a region where the source electrode 8 and the drain electrode 9 are not formed. Then, a titanium-based metal layer is formed through the mask. Then, the mask is removed so that the second layers 8b, 9b of the source electrode 8 and the drain electrode 9 can be formed by a lift-off method.

Figure 4D:
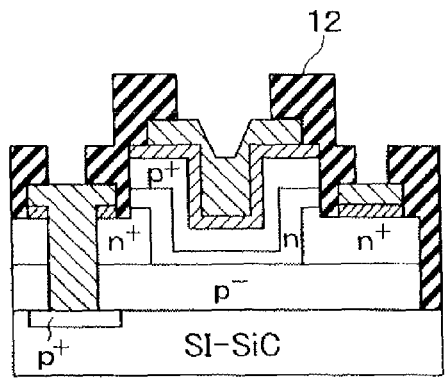

Then, in a process shown in FIG. 4D, the interlayer dielectric film 12 is formed on the entire substrate surface. Then, the interlayer dielectric film 12 is patterned to form contact holes where the second layers 7b, 8b, 9b of the gate electrode 7, the source electrode 8, and the drain electrode 9 are partially exposed.

Figure 4E:
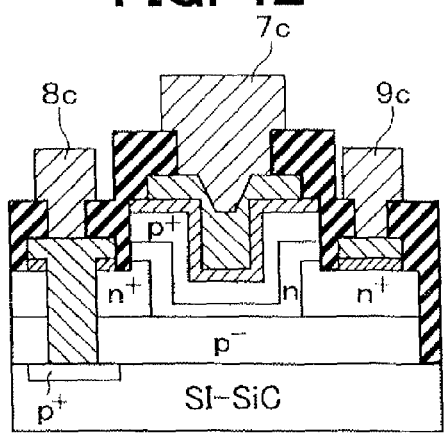

Then, in a process shown in FIG. 4E, the third layers 7c, 8c, 9c of the gate electrode 7, the source electrode 8, and the drain electrode 9 are formed on the second layers 7b, 8b, 9b, for example, by patterning an aluminum layer formed on the interlayer dielectric film 12 or by a gold plating method. In this way, the SiC semiconductor device shown in FIG. 2 can be manufactured.

As describe above, according to the first embodiment, the N-type channel layer 5 is epitaxially grown in the recess 4. In such an approach, the N-type channel layer 5 can have uniform thickness and have uniform impurity concentration. Thus, the JFET can have uniform characteristics.

The N-type channel layer 5 has the first region 5a on the bottom wall of the recess 4 and the second region 5b on the side wall of the recess 4. While the bottom wall of the recess 4 is C-face plane, the side wall of the recess is a-face plane. Since the bottom wall and the side wall of the recess 4 have different surface orientations, the first region 5a and the second region 5b can have different impurity concentrations due to dependence of impurity concentration on surface orientation and the C/Si ratio of the epitaxial growth conditions. According to the first embodiment, the impurity concentration of the first region 5a, which defines a channel length, is greater than the impurity concentration of the second region 5b. In such an approach, a channel resistance can reduced. In addition, capacitances between gate and source and between gate and drain can be reduced.

Further, the gate electrode 7 (i.e., the first layer 7a) is used as a mask to pattern the N-type channel layer 5 and the P$^+$-type gate region 6. Thus, these are self-aligned with each other. If the gate electrode 7 is formed after patterning the P$^+$-type gate region 6, there is a need to form the gate electrode 7 on a small P$^+$-type gate region 6. Therefore, it is difficult to form the gate electrode 7 in such a manner that the N-type channel layer 5, the P$^+$-type gate region 6, and the gate electrode 7 are aligned with each other. In contrast, according to the first embodiment, the N-type channel layer 5 and the P$^+$-type gate region 6 are formed by using the gate electrode 7 as a mask. In such an approach, the N-type channel layer 5, the P$^+$-type gate region 6, and the gate electrode 7 can be easily aligned with each other. Thus, a contact surface between the gate electrode 7 and the P$^+$-type gate region 6 becomes large so that the gate electrode 7 can be surely, electrically connected to the P$^+$-type gate region 6. Therefore, a gate resistance is reduced so that the JFET can perform high speed switching.

Furthermore, according to the first embodiment, the P$^+$-type gate region 6 and the N-type channel layer 5 including the N$^+$-type source region 3a and the N$^+$-type drain region 3b are formed by epitaxial growth not ion implantation. In such an approach, gate leak current can be reduced.

Second Embodiment

Figure 5:
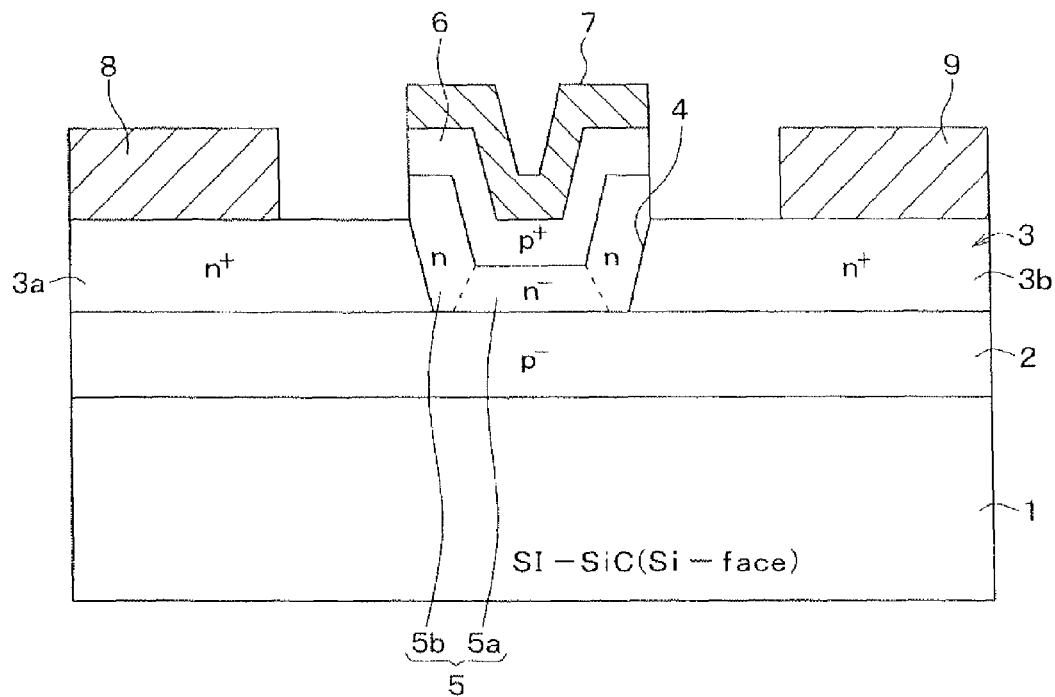
FIG. 5 is a diagram illustrating a cross-sectional view of a SiC semiconductor device having a JFET according to a second embodiment of the present invention.

A second embodiment of the present invention is described below with reference to FIG. 5. FIG. 5 illustrates a cross-sectional view of a SiC semiconductor device having a JFET according to the second embodiment. The second embodiment differs from the first embodiment in the following point.

Figure 6:
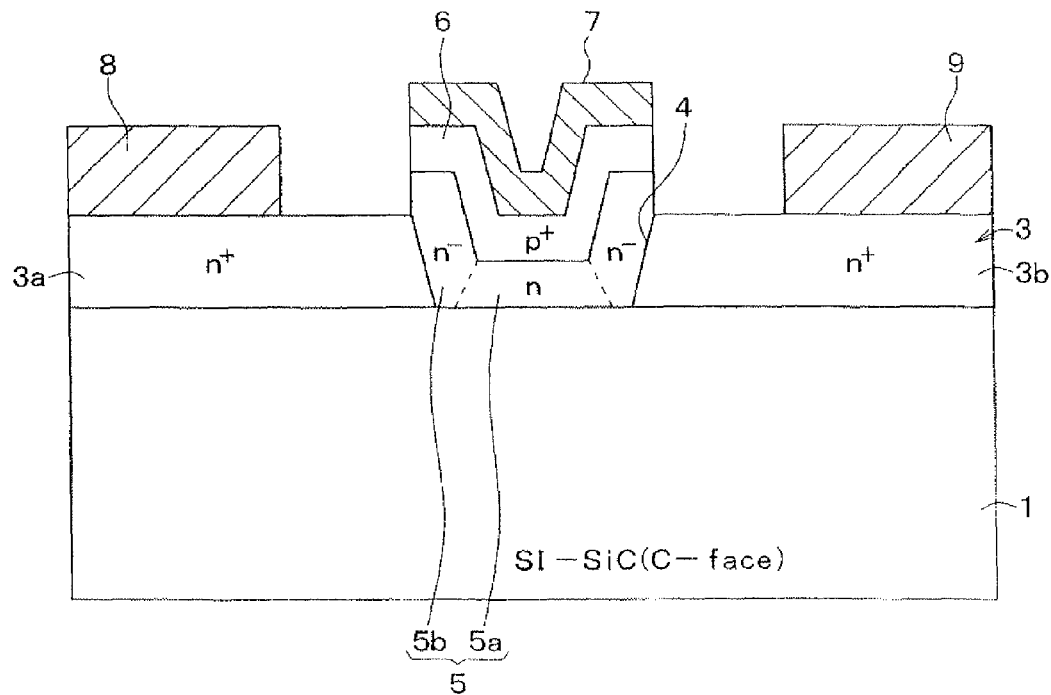
FIG. 6 is a diagram illustrating a cross-sectional view of a SiC semiconductor device having a JFET according to a third embodiment of the present invention.

As can be seen by comparing FIG. 1 and FIG. 6, a difference between the first embodiment and the second embodiment is that the main surface of the semi-insulating SiC substrate 1 is Si-face (0001).

When the main surface of the semi-insulating SiC substrate 1 is Si-face, the bottom of the recess 4 is Si-face plane, and the side wall of the recess 4 is a-face plane. Therefore, when the N-type channel layer 5 is formed by epitaxial growth in the recess 4, the impurity concentration of the second region 5b on the side wall of the recess 4 becomes greater than the impurity concentration of the first region 5a on the bottom wall of the recess 4. The first region 5a can have an N-type impurity concentration of from about $1 \times 10^{16}$ cm$^{-3}$ to about $1 \times 10^{18}$ cm$^{-3}$. For example, the first region 5a can have the N-type impurity concentration of about $1 \times 10^{17}$ cm$^{-3}$, and the N-type impurity concentration of the second region 5b can be about one and a half times to about three times greater than the N-type impurity concentration of the first region 5a.

As described above, the difference between the first embodiment and the second embodiment is only the surface orientation of the SiC substrate 1. Therefore, the SiC semiconductor device of the second embodiment can be manufactured in almost the same manner as the SiC semiconductor device of the first embodiment. Since the SiC semiconductor device of the second embodiment can have almost the same structure as the SiC semiconductor device of the first embodiment, the SiC semiconductor device of the second embodiment can have almost the same advantage as the SiC semiconductor device of the first embodiment. It is noted that since the impurity concentration of the first region 5a is lower than the impurity concentration of the second region 5b, the effects of reducing the channel resistance and the capacitances between the gate and the source and between the gate and the drain may be weakened as compared to the first embodiment. It is noted that while the impurity concentration of the first region 5a affects a cutoff frequency $f_T$, the impurity concentration of the second region 5b affects a maximum frequency $f_{max}$. Therefore, the maximum frequency $f_{max}$ of the second embodiment can be higher than that of the first embodiment.

Third Embodiment

A third embodiment of the present invention is described below with reference to FIG. 6. FIG. 6 illustrates a cross-sectional view of a SiC semiconductor device having a JFET according to the third embodiment. The third embodiment differs from the first embodiment in the following point.

According to the third embodiment, like the first embodiment, the main surface of the SiC substrate 1 is C-face. As can be seen by comparing FIG. 1 and FIG. 6, a difference between the first embodiment and the third embodiment is that the N$^+$-type layer 3 is directly formed on the main surface of the SiC substrate 1 without the P$^-$-type buffer layer 2. Accordingly, the recess 4 reaches the SiC substrate 1, and the N-type channel layer 5 is directly formed on the main surface of the SiC substrate 1.

The SiC semiconductor device of the third embodiment can have almost the advantage as the SiC semiconductor device of the first embodiment. It is noted that since the SiC semiconductor device of the third embodiment does not have the P$^-$-type buffer layer 2, a resistance to voltage breakdown of the SiC semiconductor device of the third embodiment is lower than a resistance to voltage breakdown of the SiC semiconductor device of the first embodiment. The SiC semiconductor device of the third embodiment can be manufactured in almost the same manner as the SiC semiconductor device of the first embodiment. It is noted that since the SiC semiconductor device of the third embodiment does not have the P⁻-type buffer layer 2, the process for forming the P⁻-type buffer layer 2 and the process for forming the recess 11 through which the P⁻-type buffer layer 2 and the source electrode 8 are electrically connected together are omitted.

Fourth Embodiment

Figure 7:
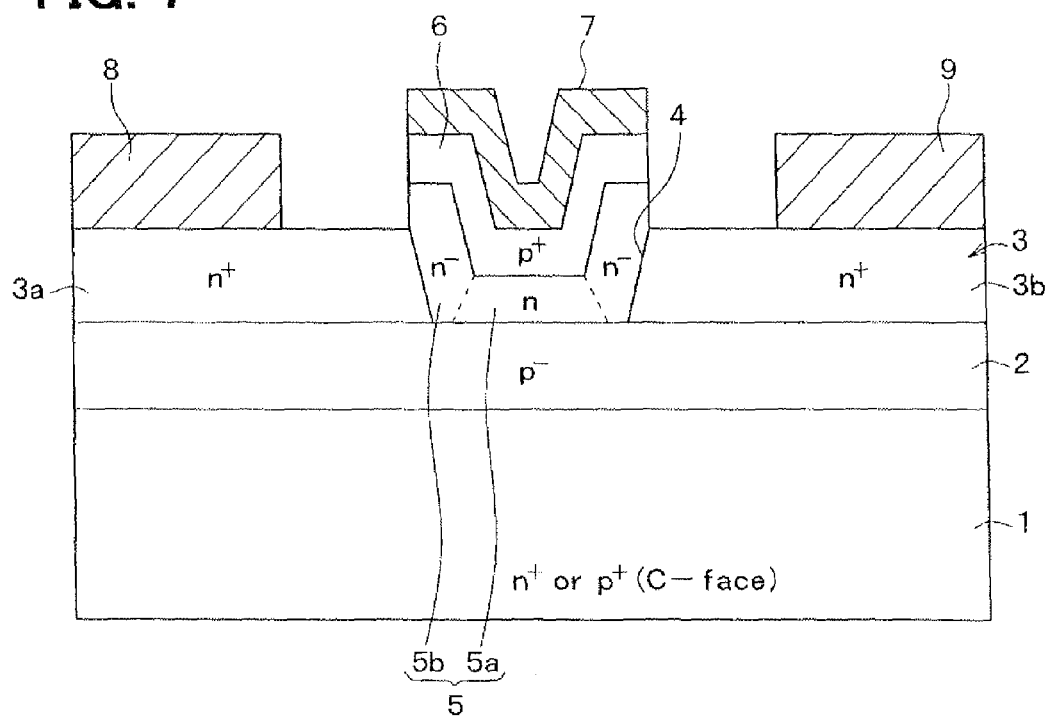
FIG. 7 is a diagram illustrating a cross-sectional view of a SiC semiconductor device having a JFET according to a fourth embodiment of the present invention.

A fourth embodiment of the present invention is described below with reference to FIG. 7. FIG. 7 illustrates a cross-sectional view of a SiC semiconductor device having a JFET according to the fourth embodiment. The fourth embodiment differs from the first embodiment in the following point.

According to the fourth embodiment, like the first embodiment, the main surface of the SiC substrate 1 is C-face. As can be seen by comparing FIG. 1 and FIG. 7, a difference between the first embodiment and the third embodiment is that the SiC substrate 1 is an N⁺-type substrate. The SiC substrate 1 can have an impurity concentration of from about $1 \times 10^{18}$ cm⁻³ to about $1 \times 10^{19}$ cm⁻³ and a thickness of from about 50 μm to about 400 μm. For example, the SiC substrate 1 can have the thickness of about 350 μm.

Although the SiC substrate 1 is an N⁺-type substrate, the N⁺-type source region 3a and the N⁺-type drain region 3b are electrically insulated from each other by the P⁺-type buffer layer 2. Therefore, the SiC semiconductor device of the fourth embodiment can operate in almost the same manner as the SiC semiconductor device of the first embodiment. Accordingly, the SiC semiconductor device of the fourth embodiment can have almost the same advantage as the SiC semiconductor device of the first embodiment.

Like the first embodiment, the P⁻-type buffer layer 2 and the source electrode 8 can be electrically connected together by forming the P⁺-type contact region 10 and the recess 11. Alternatively, the SiC substrate 1 can be an N⁺-type substrate having a main surface that is Si-face.

Fifth Embodiment

Figure 8:
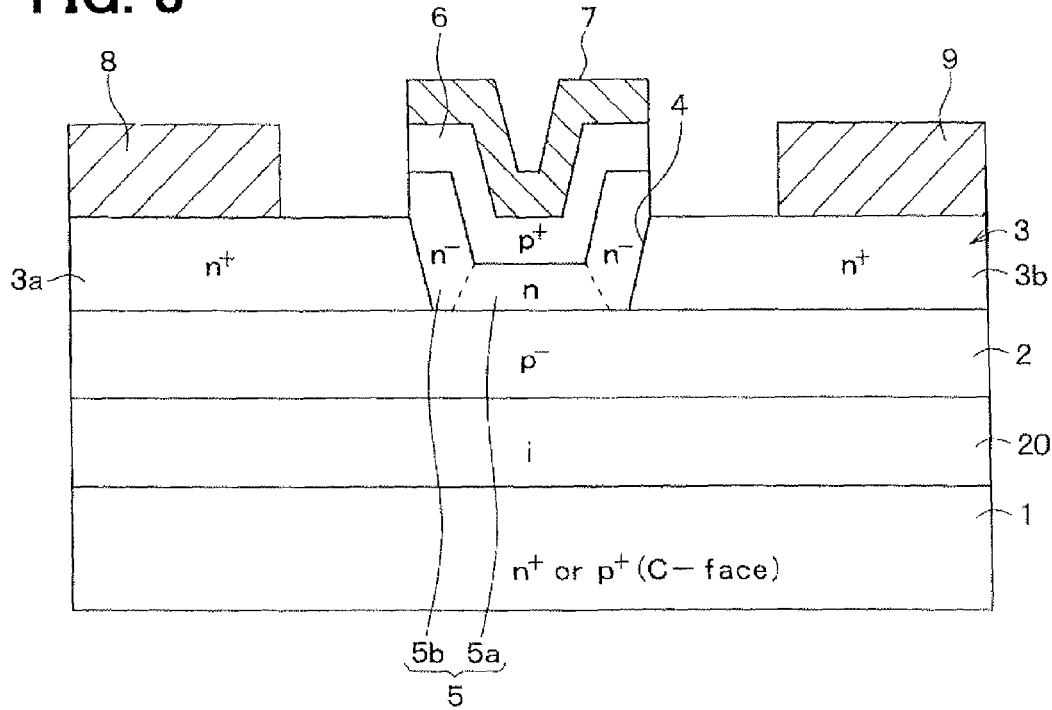
FIG. 8 is a diagram illustrating a cross-sectional view of a SiC semiconductor device having a JFET according to a fifth embodiment of the present invention.

A fifth embodiment of the present invention is described below with reference to FIG. 8. FIG. 8 illustrates a cross-sectional view of a SiC semiconductor device having a JFET according to the fifth embodiment. The fifth embodiment differs from the first embodiment in the following point.

As can be seen by comparing FIG. 1 and FIG. 8, a difference between the first embodiment and the fifth embodiment is that the SiC substrate 1 is an N⁺-type substrate having a main surface that is C-face. Another difference between the first embodiment and the fifth embodiment is that an i-type buffer layer 20 is formed between the SiC substrate 1 and the P⁻-type buffer layer 2. The i-type buffer layer 20 is made of i-type silicon carbide (SiC). The i-type buffer layer 20 can have an impurity concentration of from about $1 \times 10^{10}$ cm⁻³ to about $1 \times 10^{14}$ cm⁻³ and a thickness of from about 0.2 μm to about 2.0 μm. For example, the i-type buffer layer 20 can have the impurity concentration of about $1 \times 10^{12}$ cm⁻³ and the thickness of about 0.4 μm.

As mentioned in the first embodiment, when the SiC substrate 1 is made of semi-insulating material, RF waves generated when the JFET operates can be absorbed by the SiC substrate 1. Therefore, the SiC semiconductor device using the semi-insulating SiC substrate 1 can be suitable for high frequency application. In contrast, when the SiC substrate 1 is an N⁺-type substrate, the RF waves generated when the JFET operates may not be fully absorbed by the SiC substrate 1. Therefore, the SiC semiconductor device using the N⁺-type SiC substrate 1 may not be suitable for high frequency application. According to the fifth embodiment, the i-type buffer layer 20 formed between the SiC substrate 1 and the P⁻-type buffer layer 2 can absorb the RF waves generated when the JFET operates. Therefore, although the SiC semiconductor device of the fifth embodiment uses the N⁺-type SiC substrate 1, the SiC semiconductor device of the fifth embodiment can be suitable for high frequency application.

Like the first embodiment, the P⁻-type buffer layer 2 and the source electrode 8 can be electrically connected together by forming the P⁺-type contact region 10 and the recess 11. However, according to the fifth embodiment, since the i-type buffer layer 20 is formed between the SiC substrate 1 and the P⁻-type buffer layer 2, the P⁺-type contact region 10 is formed in a surface portion of the i-type buffer layer 20 to be in contact with the P⁻-type buffer layer 2 or formed by ion-implanting impurities directly into the P⁻-type buffer layer 2. Alternatively, the SiC substrate 1 can be an N⁺-type substrate having a main surface that is Si-face.

Sixth Embodiment

Figure 9:
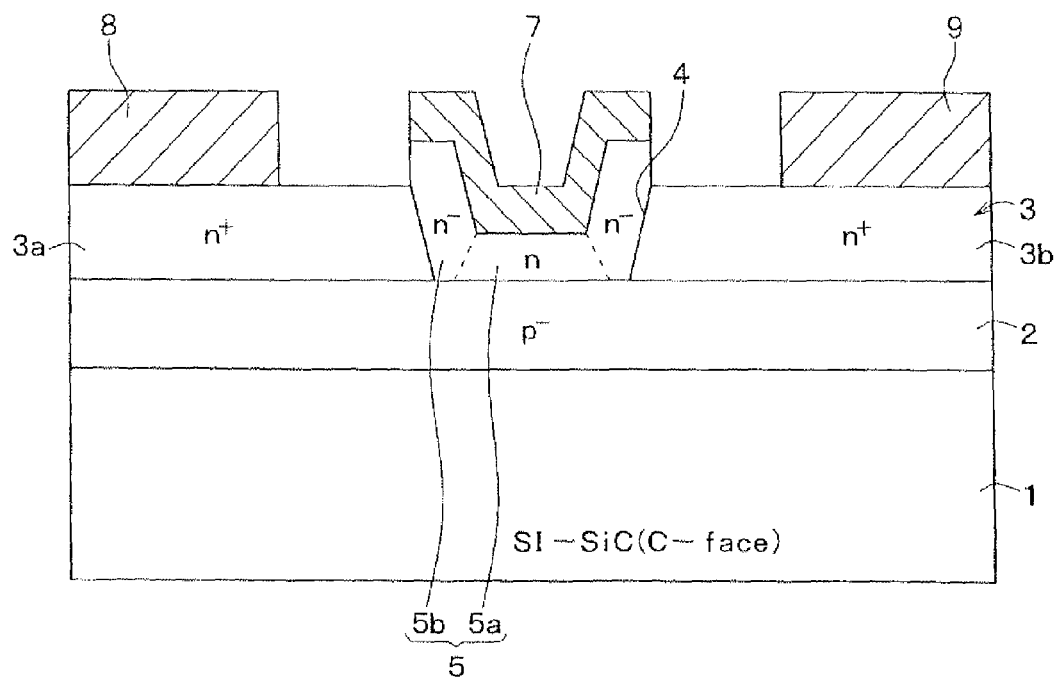
FIG. 9 is a diagram illustrating a cross-sectional view of a SiC semiconductor device having a MESFET according to a sixth embodiment of the present invention.

A sixth embodiment of the present invention is described below with reference to FIG. 9. FIG. 9 illustrates a cross-sectional view of a SiC semiconductor device having a metal semiconductor field effect transistor (MESFET) according to the sixth embodiment. The sixth embodiment differs from the first embodiment in the following point.

According to the sixth embodiment, like the first embodiment, the main surface of the semi-insulating SiC substrate 1 is C-face. As can be seen by comparing FIG. 1 and FIG. 9, a difference between the first embodiment and the sixth embodiment is that the gate electrode 7 is directly formed on the surface of the N-type channel layer 5 without the P⁺-type gate region 6. The gate electrode 7 forms a Schottky contact with the N-type channel layer 5 to serve as a Schottky electrode. The gate electrode 7 is made of metal that can form a Schottky contact with N-type SiC. The gate electrode 7 can have a thickness of from about 0.1 μm to about 1.0 μm. For example, the gate electrode 7 can have the thickness of about 0.2 μm.

The MESFET formed in the SiC semiconductor device operates as follows. When a gate voltage is not applied to the gate electrode 7 as a Schottky electrode, the N-type channel layer 5 pinches off due to a depletion layer that extends from the gate electrode 7 through the N-type channel layer 5 based on a difference in work function between the N-type channel layer 5 and the gate electrode 7. Then, when the gate voltage beyond a Schottky barrier is applied to the gate electrode 7, a channel region is formed in the N-type channel layer 5 so that electric current can flow between the source electrode 8 and the drain electrode 9 through the channel region. Thus, the MESFET can act as a normally-off type device.

Since the N-type channel layer 5 can have a uniform thickness, the SiC semiconductor device having the MESFET of the sixth embodiment can have the same advantage as the SiC semiconductor device having the JFET of the first embodiment. Therefore, the MESFET can have uniform characteristics.

The SiC semiconductor device of the sixth embodiment can be manufactured in almost the same manner as the SiC semiconductor device of the first embodiment. For example, the N-type channel layer 5 is epitaxially grown in the recess 4. In such an approach, the N-type channel layer 5 can have uniform thickness and has uniform impurity concentration. Accordingly, the MESFET can have uniform characteristics.

In is noted that since the SiC semiconductor device of the sixth embodiment does not have the P$^+$-type gate region 6, the process for forming the P$^+$-type gate region 6 is omitted. Further, since the N-type channel layer 5 is patterned by using the gate electrode 7 as a mask, the N-type channel layer 5 and the gate electrode 7 can be self-aligned. Therefore, there is no need to from the gate electrode 7 on a small N-type channel layer 5, and the N-type channel layer 5 and the gate electrode 7 can be easily aligned with each other.

As described above, according to the sixth embodiment, the SiC substrate 1 is a semi-insulating substrate having a main surface that is C-face. Alternatively, like the second embodiment, the SiC substrate 1 can be a semi-insulating substrate having a main surface that is Si-face. Alternatively, like the fourth embodiment, the SiC substrate 1 can be a N$^+$-type substrate having a main surface that is C-face or Si-face.

Seventh Embodiment

Figure 10:
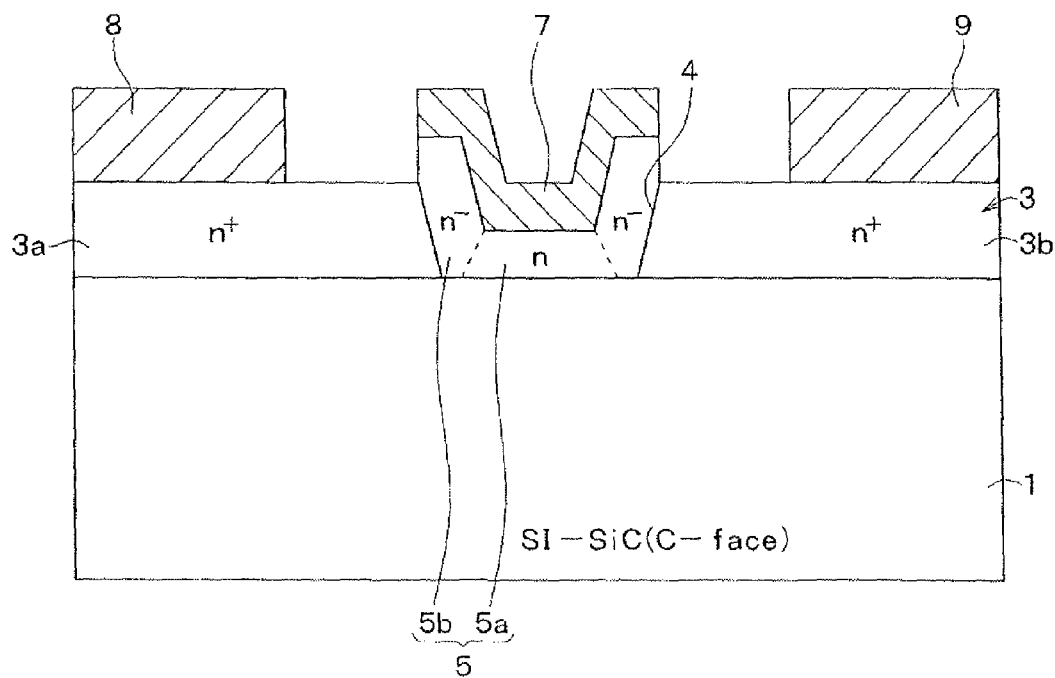
FIG. 10 is a diagram illustrating a cross-sectional view of a SiC semiconductor device having a MESFET according to a seventh embodiment of the present invention.

A seventh embodiment of the present invention is described below with reference to FIG. 10. FIG. 10 illustrates a cross-sectional view of a SiC semiconductor device having a MESFET according to the seventh embodiment. The seventh embodiment differs from the sixth embodiment in the following point.

According to the seventh embodiment, like the first embodiment, the main surface of the SiC substrate 1 is C-face. As can be seen by comparing FIG. 9 and FIG. 10, a difference between the sixth embodiment and the seventh embodiment is that the N$^+$-type layer 3 is directly formed on the main surface of the SiC substrate 1 without the P$^-$-type buffer layer 2. Accordingly, the recess 4 reaches the SiC substrate 1, and the N-type channel layer 5 is directly formed on the main surface of the SiC substrate 1.

The SiC semiconductor device of the seventh embodiment can have almost the advantage as the SiC semiconductor device of the sixth embodiment. It is noted that since the SiC semiconductor device of the seventh embodiment does not have the P$^-$-type buffer layer 2, a resistance to voltage breakdown of the SiC semiconductor device of the seventh embodiment is lower than a resistance to voltage breakdown of the SiC semiconductor device of the sixth embodiment. The SiC semiconductor device of the seventh embodiment can be manufactured in almost the same manner as the SiC semiconductor device of the sixth embodiment. It is noted that since the SiC semiconductor device of the seventh embodiment does not have the P$^-$-type buffer layer 2, the process for forming the P$^-$-type buffer layer 2 is omitted.

As described above, according to the seventh embodiment, the SiC substrate 1 is a semi-insulating substrate having a main surface that is C-face. Alternatively, like, the second embodiment, the SiC substrate 1 can be a semi-insulating substrate having a main surface that is Si-face.

Eighth Embodiment

Figure 11:
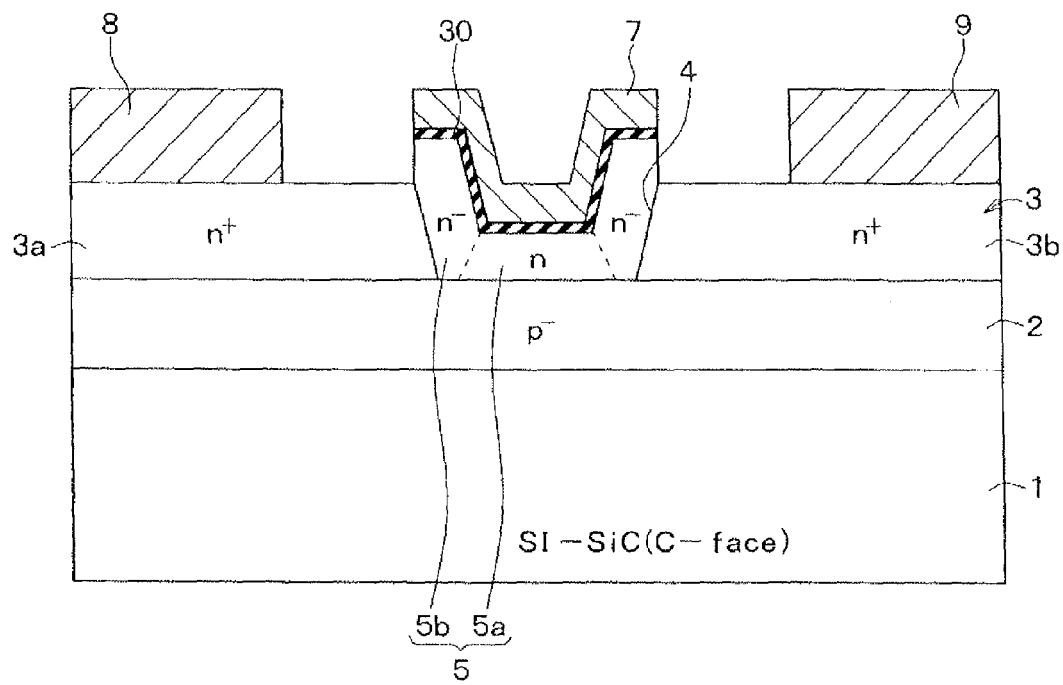
FIG. 11 is a diagram illustrating a cross-sectional view of a SiC semiconductor device having a MOSFET according to an eighth embodiment of the present invention.

An eighth embodiment of the present invention is described below with reference to FIG. 11. FIG. 11 illustrates a cross-sectional view of a SiC semiconductor device having a metal oxide semiconductor field effect transistor (MOSFET) according to the eighth embodiment. The eighth embodiment differs from the first embodiment in the following point.

According to the eighth embodiment, like the first embodiment, the main surface of the semi-insulating SiC substrate 1 is C-face. As can be seen by comparing FIG. 1 and FIG. 11, differences between the first embodiment and the eighth embodiment are that the P$^+$-type gate region 6 is omitted and that the gate electrode 7 is formed on the surface of the n-type channel layer 5 through a gate insulating layer 30. For example, the gate insulating layer 30 can be made of silicon oxide (SiO$_2$). The gate insulating layer 30 can have a thickness of from about 0.01 μm to about 0.1 μm. For example, the gate insulating layer 30 can have the thickness of about 0.02 μm.

The MOSFET formed in the SiC semiconductor device operates as follows. When a gate voltage is not applied to the gate electrode 7, the N-type channel layer 5 pinches off due to a depletion layer that extends from the gate insulating layer 30 through the N-type channel layer 5 based on a difference in work function between the N-type channel layer 5 and the gate electrode 7. Then, when the gate voltage is applied to the gate electrode 7, an accumulation-mode channel is formed in the N-type channel layer 5 so that electric current can flow between the source electrode 8 and the drain electrode 9 through the channel. Thus, the MOSFET can act as a normally-off type device.

Since the N-type channel layer 5 can have uniform thickness, the SiC semiconductor device having the MOSFET of the eighth embodiment can have the same advantage as the SiC semiconductor device having the JFET of the first embodiment. Therefore, the MOSFET can have uniform characteristics.

The SiC semiconductor device of the eighth embodiment can be manufactured in almost the same manner as the SiC semiconductor device of the first embodiment. It is noted that since the SiC semiconductor device of the eighth embodiment has the gate insulating layer 30 but does not have the P$^+$-type gate region 6, a process for forming the gate insulating layer 30 by thermal oxidation or the like is added, and the process for forming the P$^+$-type gate region 6 is omitted. Since the N-type channel layer 5 is formed in the recess 4 by epitaxial growth, the N-type channel layer 5 can have uniform thickness and uniform impurity concentration. Therefore, the MOSFET can have uniform characteristics. Further, since the N-type channel layer 5 is patterned by using the gate electrode 7 as a mask, the N-type channel layer 5 and the gate electrode 7 can be self-aligned. Therefore, there is no need to from the gate electrode 7 on a small N-type channel layer 5, and the N-type channel layer 5 and the gate electrode 7 can be easily aligned with each other.

As described above, according to the eighth embodiment, the SiC substrate 1 is a semi-insulating substrate having a main surface that is C-face. Alternatively, like the second embodiment, the SiC substrate 1 can be a semi-insulating substrate having a main surface that is Si-face plane. Alternatively, like the fourth embodiment, the SiC substrate 1 can be a N$^+$-type substrate having a main surface that is C-face or Si-face plane.

Ninth Embodiment

Figure 12:
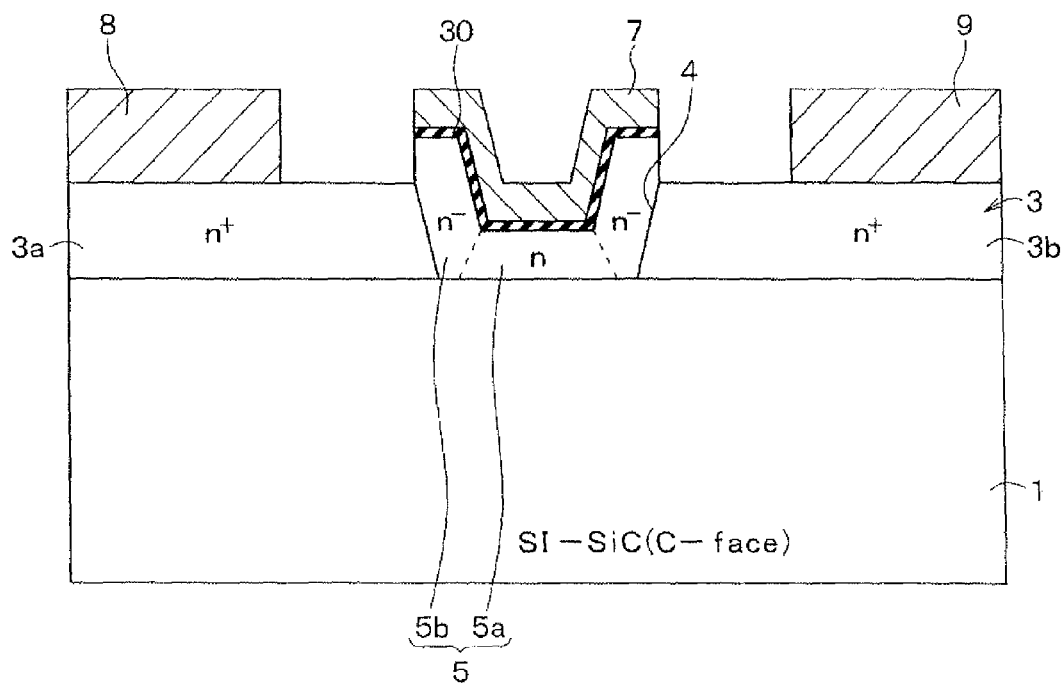
FIG. 12 is a diagram illustrating a cross-sectional view of a SiC semiconductor device having a MOSFET according to a ninth embodiment of the present invention.

A ninth embodiment of the present invention is described below with reference to FIG. 12. FIG. 12 illustrates a cross-sectional view of a SiC semiconductor device having a MOSFET according to the ninth embodiment. The ninth embodiment differs from the eighth embodiment in the following point.

According to the ninth embodiment, like the eighth embodiment, the main surface of the SiC substrate 1 is C-face. As can be seen by comparing FIG. 11 and FIG. 12, a difference between the eighth embodiment and the ninth embodiment is that the N$^+$-type layer 3 is directly formed on the main surface of the SiC substrate 1 without the P⁻-type buffer layer 2. Accordingly, the recess 4 reaches the SiC substrate 1, and the N-type channel layer 5 is directly formed on the main surface of the SiC substrate 1.

The SiC semiconductor device of the ninth embodiment can have almost the advantage as the SiC semiconductor device of the eighth embodiment. It is noted that since the SiC semiconductor device of the ninth embodiment does not have the P⁻-type buffer layer 2, a resistance to voltage breakdown of the SiC semiconductor device of the ninth embodiment is lower than a resistance to voltage breakdown of the SiC semiconductor device of the eighth embodiment. The SiC semiconductor device of the ninth embodiment can be manufactured in almost the same manner as the SiC semiconductor device of the eighth embodiment. It is noted that the SiC semiconductor device of the ninth embodiment does not have the P⁻-type buffer layer 2, the process for forming the P⁻-type buffer layer 2 is omitted.

As described above, according to the ninth embodiment, the SiC substrate 1 is a semi-insulating substrate having a main surface that is C-face. Alternatively, like the second embodiment, the SiC substrate 1 can be a semi-insulating substrate having a main surface that is Si-face.

(Modifications)

The embodiment described above can be modified in various ways, for example, as follows.

In the embodiments, the JFET, the MESFET, and the MOSFET have the N-type channel layer 5 as a channel. That is, the JFET, the MESFET, and the MOSFET are configured as N-channel devices. Alternatively, the JFET, the MESFET, and the MOSFET can be configured as P-channel devices.

In the embodiments, the gate electrode 7, the source electrode 8, and the drain electrode 9 have a three-layer structure including a nickel-based metal layer, a titanium-based metal layer, and an aluminum layer or a gold layer. Alternatively, the gate electrode 7, the source electrode 8, and the drain electrode 9 can have a structure other than the three-layer structure. For example, the gate electrode 7, the source electrode 8, and the drain electrode 9 can have a multilayer structure of Ni/Ti/Mo/Au, Ti/Mo/Ni/Au, Ni/Mo/Ti, Ti/Mo/Ni, Ti/Mo, or Ni/Mo. For another example, the gate electrode 7, the source electrode 8, and the drain electrode 9 can have a single layer structure of Ti or Ni.

The semiconductor device according to the embodiments is based on SiC. Alternatively, the semiconductor device can be based on semiconductor other than Sic. For example, the semiconductor device can be based on silicon (Si). For another example, the semiconductor device can be based on wide-gap semiconductor such as gallium nitride (GaN), diamond, or aluminum nitride (AlN).

It is noted that there are 3 types of trench shapes in the embodiments. In FIGS. 1 and 5-12, the side wall of the recess is inclined at an angle of more than 90° with respect to the bottom wall of the recess. In FIG. 2, the side wall of the recess is inclined at an angle of about 90° with respect to the bottom wall of the recess, and the side wall forms a rounded corner with the bottom wall. In FIGS. 3A-3F and 4A-4E, the side wall of the recess is inclined at an angle of about 90° with respect to the bottom wall of the recess, and the side wall forms a sharp corner with the bottom wall. That is, different shapes of the trenches are possible, depending on the trench etch and epitaxial growth process conditions.

Such changes and modifications are to be understood as being within the scope of the present invention as defined by the appended claims.

What is claimed is:

1. A semiconductor device having a junction field-effect transistor (JFET) comprising:
    a semiconductor substrate having a main surface;
    a first conductivity type semiconductor layer epitaxially grown on the main surface of the substrate, the first conductivity type semiconductor layer having a back surface opposite to the main surface;
    a recess having a bottom defined by the main surface of the substrate and a side wall defined by the semiconductor layer, a depth of the recess equaling a thickness of the semiconductor layer in a direction from the main surface to the back surface, and the recess dividing the semiconductor layer into a source region and a drain region;
    a first conductivity type channel layer epitaxially grown on the bottom and the side wall of the recess, the channel layer having an impurity concentration lower than an impurity concentration of the semiconductor layer;
    a second conductivity type gate region epitaxially grown on a surface of the channel layer, the gate region spaced by the channel layer from the source region and the drain region;
    a gate electrode electrically connected to the gate region;
    a source electrode electrically connected to the source region; and
    a drain electrode electrically connected to the drain region.

2. The semiconductor device according to claim 1, wherein the substrate is a wide bandgap semiconductor (WBG) substrate.

3. The semiconductor device according to claim 2, wherein
    the substrate is a silicon carbide (SiC) substrate with a C-face as the main surface, the first conductivity type is N-type,
    the second conductivity type is P-type,
    the bottom of the recess is C-face plane,
    the side wall of the recess is a-face plane,
    the channel layer has a first region on the bottom of the recess and a second region of the side wall of the recess, and
    an impurity concentration of the first region of the channel layer is greater than an impurity concentration of the second region of the channel layer.

4. The semiconductor device according to claim 3, wherein a thickness of the channel layer ranges from 0.1 µm to 1.0 µm.

5. The semiconductor device according to claim 3, wherein an impurity concentration of the gate region ranges from $5 \times 10^{18}$ cm⁻³ to $5 \times 10^{19}$ cm⁻³.

6. The semiconductor device according to claim 3, wherein the substrate is a semi-insulating silicon carbide substrate having a resistivity of from $1 \times 10^{10}$ Ω·cm⁻³ to $1 \times 10^{11}$ Ω·cm⁻³.

7. The semiconductor device according to claim 3, wherein
    the substrate has a second conductivity type buffer layer defining the main surface of the semiconductor substrate, wherein
    an impurity concentration of the buffer layer is lower than an impurity concentration of the gate region.

8. The semiconductor device according to claim 7, wherein the substrate has a second conductivity type contact region at its surface portion,
    the contact region is in contact with the buffer layer and has an impurity concentration greater than the impurity concentration of the buffer layer, the source electrode extends to an inside of another recess, and the other recess penetrates the source region and the buffer layer so that the buffer layer and the source electrode are electrically connected together through the contact region.

9. The semiconductor device according to claim 3, wherein
the substrate has a second conductivity type buffer layer defining the main surface of the semiconductor substrate, wherein
an impurity concentration of the buffer layer is lower than an impurity concentration of the gate region, and
the substrate is a first conductivity type substrate.

10. The semiconductor device according to claim 9, wherein
the substrate has an i-type buffer layer located under the second conductivity type buffer layer.

11. The semiconductor device according to claim 10, wherein a thickness of the i-type buffer layer ranges from 0.2 µm to 2.0 µm.

12. The semiconductor device according to claim 3, wherein
the impurity concentration of the first region of the channel layer is twice to ten times greater than the impurity concentration of the second region of the channel layer.

13. The semiconductor device according to claim 12, wherein the impurity concentration of the first region of the channel layer ranges from $1\times10^{16}$ cm$^{-3}$ to $1\times10^{18}$ cm$^{-3}$.

14. The semiconductor device according to claim 2, wherein
the substrate is a silicon carbide substrate with a Si-face as the main surface,
the first conductivity type is N-type,
the second conductivity type is P-type,
the bottom of the recess is Si-face plane,
the side wall of the recess is a-face plane,
the channel layer has a first region on the bottom of the recess and a second region of the side wall of the recess, and
an impurity concentration of the second region of the channel layer is greater than an impurity concentration of the first region of the channel layer.

15. The semiconductor device according to claim 14, wherein the impurity concentration of the second region of the channel layer is one and a half times to three times greater than the impurity concentration of the first region of the channel layer.

16. The semiconductor device according to claim 15, wherein the impurity concentration of the first region of the channel layer ranges from $1\times10^{16}$ cm$^{-3}$ to $1\times10^{18}$ cm$^{-3}$.

17. A semiconductor device having a metal-semiconductor field-effect transistor (MESFET) comprising:
a semiconductor substrate having a main surface;
a first conductivity type semiconductor layer epitaxially grown on the main surface of the substrate, the first conductivity type semiconductor layer having a back surface opposite to the main surface;
a recess having a bottom defined by the main surface of the substrate and a side wall defined by the semiconductor layer, a depth of the recess equaling a thickness of the semiconductor layer in a direction from the main surface to the back surface, and the recess dividing the semiconductor layer into a source region and a drain region;
a first conductivity type channel layer epitaxially grown on the bottom and the side wall of the recess, the channel layer having an impurity concentration lower than an impurity concentration of the semiconductor layer;
a gate electrode located on a surface of the channel layer to form a Schottky contact with the channel layer, the gate electrode spaced by the channel layer from the source region and the drain region;
a source electrode electrically connected to the source region; and
a drain electrode electrically connected to the drain region.

18. A semiconductor device having a metal-oxide-semiconductor field-effect transistor (MOSFET) comprising:
a semiconductor substrate having a main surface;
a first conductivity type semiconductor layer epitaxially grown on the main surface of the substrate, the first conductivity type semiconductor layer having a back surface opposite to the main surface;
a recess having a bottom defined by the main surface of the substrate and a side wall defined by the semiconductor layer, a depth of the recess equaling a thickness of the semiconductor layer in a direction from the main surface to the back surface, and the recess dividing the semiconductor layer into a source region and a drain region;
a first conductivity type channel layer epitaxially grown on the bottom and the side wall of the recess, the channel layer having an impurity concentration lower than an impurity concentration of the semiconductor layer;
a gate insulating layer on a surface of the channel layer;
a gate electrode on the surface of the channel layer through the gate insulating layer;
a source electrode electrically connected to the source region; and
a drain electrode electrically connected to the drain region.

19. A method of making a semiconductor device having a junction field-effect transistor (JFET), the method comprising:
preparing a semiconductor substrate having a main surface;
forming a first conductivity type semiconductor layer on the main surface of the substrate by epitaxial growth that includes forming a back surface opposite to the main surface;
forming a recess by anisotropic etching of the semiconductor layer in such a manner that the recess divides the semiconductor layer into a source region and a drain region and has a bottom defined by the main surface of the substrate and a side wall defined by the semiconductor layer, the recess having a depth equaling a thickness of the semiconductor layer in a direction from the main surface to the back surface, and
forming a first conductivity type channel layer on the bottom and the side wall of the recess by epitaxial growth in such a manner that the channel layer has an impurity concentration lower than an impurity concentration of the semiconductor layer;
forming a second conductivity type gate region on a surface of the channel layer by epitaxial growth in such a manner that the gate region is spaced by the channel layer from the source region and the drain region;
forming a gate electrode electrically connected to the gate region;
forming a source electrode electrically connected to the source region; and
forming a drain electrode electrically connected to the drain region.

20. The method according to claim 19, wherein
forming the gate electrode includes patterning a part of the gate electrode,
forming the gate region includes patterning the gate region using the patterned part of the gate electrode, and forming the channel region includes patterning the channel region using the patterned part of the gate electrode as a mask.

21. The method according to claim 19, wherein
forming the recess includes placing a mask on the surface of the semiconductor layer, the mask having an opening at a position corresponding to the recess and being made of photoresist or silicon oxide, and
forming the recess further includes performing the anisotropic etching of the semiconductor layer using the placed mask in such a manner that the side wall of the recess is inclined at an angle of from 85° to 86° with respect to the bottom wall of the recess.

22. The method according to claim 19, wherein
forming the recess includes placing a mask on the surface of the semiconductor layer, the mask having an opening at a position corresponding to the recess and being made of metal, and
forming the recess further includes performing the anisotropic etching of the semiconductor layer using the placed mask in such a manner that the side wall of the recess is inclined at an angle of from 89° to 90° with respect to the bottom wall of the recess.

23. A method of making a semiconductor device having a metal-semiconductor field-effect transistor (MESFET), the method comprising:
preparing a semiconductor substrate having a main surface;
forming a first conductivity type semiconductor layer on the main surface of the substrate by epitaxial growth that includes forming a back surface opposite to the main surface;
forming a recess by anisotropic etching of the semiconductor layer in such a manner that the recess divides the semiconductor layer into a source region and a drain region and has a bottom defined by the main surface of the substrate and a side wall defined by the semiconductor layer, the recess having a depth equaling a thickness of the semiconductor layer in a direction from the main surface to the back surface;
forming a first conductivity type channel layer on the bottom and the side wall of the recess by epitaxial growth in such a manner that the channel layer has an impurity concentration lower than an impurity concentration of the semiconductor layer;
forming a gate electrode on a surface of the channel layer by epitaxial growth in such a manner that the gate electrode forms a Schottky contact with the channel layer and is spaced by the channel layer from the source region and the drain region;
forming a source electrode electrically connected to the source region; and
forming a drain electrode electrically connected to the drain region.

24. The method according to claim 23, wherein
forming the gate electrode includes patterning a part of the gate electrode, and
forming the channel region includes patterning the channel region using the patterned part of the gate electrode as a mask.

25. A method of making a semiconductor device having a metal-oxide-semiconductor field-effect transistor (MOSFET), the method comprising:
preparing a semiconductor substrate having a main surface;
forming a first conductivity type semiconductor layer on the main surface of the substrate by epitaxial growth that includes forming a back surface opposite to the main surface;
forming a recess by anisotropic etching of the semiconductor layer in such a manner that the recess divides the semiconductor layer into a source region and a drain region and has a bottom defined by the main surface of the substrate and a side wall defined by the semiconductor layer, the recess having a depth equaling a thickness of the semiconductor layer in a direction from the main surface to the back surface;
forming a first conductivity type channel layer on the bottom and the side wall of the recess by epitaxial growth in such a manner that the channel layer has an impurity concentration lower than an impurity concentration of the semiconductor layer;
forming a gate insulating layer on a surface of the channel layer;
forming a gate electrode on the gate insulating layer;
forming a source electrode electrically connected to the source region; and
forming a drain electrode electrically connected to the drain region.

* * * * *